United States Patent [19]

Long

[11] 4,433,249
[45] Feb. 21, 1984

[54] ENERGY CONSERVATION SYSTEM

[75] Inventor: Walter E. Long, Ballwin, Mo.

[73] Assignee: Monsanto Company, St. Louis, Mo.

[21] Appl. No.: 301,180

[22] Filed: Sep. 11, 1981

[51] Int. Cl.$^3$ .............................................. H02J 1/00
[52] U.S. Cl. ..................................... 307/31; 307/116; 307/126; 307/141; 361/92
[58] Field of Search ..................... 307/35, 38, 39, 141, 307/31, 139, 116, 125, 126, 252 B; 200/61.5; 361/103, 92; 323/324

[56] References Cited

U.S. PATENT DOCUMENTS

| | | | |
|---|---|---|---|
| 4,016,518 | 4/1977 | Lang et al. | 361/92 X |
| 4,025,823 | 5/1977 | Lang et al. | 361/92 X |
| 4,075,584 | 2/1978 | Castonguay et al. | 361/92 X |
| 4,086,643 | 4/1978 | Jacobs | 361/92 |
| 4,310,770 | 1/1982 | Keener et al. | 307/35 |
| 4,324,987 | 4/1982 | Sullivan et al. | 307/35 |
| 4,327,397 | 4/1982 | McCleery | 361/92 X |
| 4,336,462 | 6/1982 | Hedges et al. | 307/35 |

OTHER PUBLICATIONS

J. R. Nelson, Some Ideas for Monitoring A.C. Power Lines, CQ, Jul., 1973, p. 56.

Primary Examiner—E. A. Goldberg
Assistant Examiner—Derek Jennings
Attorney, Agent, or Firm—Joseph D. Kennedy; James W. Williams, Jr.

[57] ABSTRACT

Conservation system for use with a power source which supplies power over premises wiring to utilization equipment such as lighting equipment. Contactors and a control system are provided to temporarily interrupt the supplying of power from the power source to at least a portion of the utilization equipment. At least one switching circuit is connected in series between the power source and that portion of the utilization equipment. The switching circuit is responsive to the temporary interruption of power to open the circuit between the power source and that portion of the utilization equipment and to maintain that circuit open after the temporary interruption of power ceases, thereby automatically deenergizing that portion of the utilization equipment upon interruption of the power.

13 Claims, 2 Drawing Figures

ENERGY CONSERVATION SYSTEM

BACKGROUND OF THE INVENTION

This invention relates to energy conservation systems and more particularly to energy conservation systems for use with a power source which supplies power over premises wiring to utilization equipment such as lighting equipment and the like.

The cost of energy has made it increasingly desirable to conserve it by reducing wasteful and unnecessary power consumption by equipment, such as unutilized lights, fans and the like, within a building. Lights are often left burning after hours in many areas where they are not needed. The yearly cost of this in a large building can be thousands of dollars.

Automated lighting control systems have been proposed to solve this problem, but most require either extensive rewiring in the building or do not permit local override of the automatic control. Extensive rewiring is often required because at the most accessible points, the light switches, usually only one side of the line is available. One approach to automated control of lighting, or other utilization equipment, which does not require extensive rewiring involves impressing a control signal or signals on the a.c. power lines. However, this approach requires a detector circuit at each point in the circuit at which automated control is desired. In addition any transformers in the circuit distort the impressed control signal or signals. Systems using this latter approach are shown in U.S. Pat. Nos. 3,359,551 and 4,217,646.

SUMMARY OF THE INVENTION

Among the several objects of the invention may be noted the provision of an energy conservation system for use with premises wiring and utilization equipment such as lighting equipment and the like which reduces wasteful and unnecessary power consumption by utilization equipment; the provision of such an energy conservation system which does not require extensive rewiring of the premises wiring; the provision of such an energy conservation system which is not affected by the presence of transformers in the distribution system; the provision of such an energy conservation system utilizing electronic switching equipment which is conveniently installed, economical, compact and reliable; and the provision of such an energy conservation system which can be locally overridden.

Briefly, the energy conservation system of this invention includes means for temporarily interrupting the supplying of power from a power source over premises wiring to at least a portion of utilization equipment such as lighting equipment and the like. At least one switching circuit is connected in series between the power source and the portion of the utilization equipment and that switching circuit is responsive to the temporary interruption of power to open the circuit between the power source and the portion of the utilization equipment. The switching circuit also maintains the circuit between the power source and the portion of the utilization equipment open after the temporary interruption of power ceases, thereby automatically deenergizing the portion of the utilization equipment upon interruption of the power.

Other objects and features will be in part apparent and in part pointed out hereafter.

BRIEF DESCRIPTION OF THE DRAWINGS

Corresponding reference characters indicate corresponding parts throughout the several views of the drawings.

DESCRIPTION OF A PREFERRED EMBODIMENT

Figure 1:
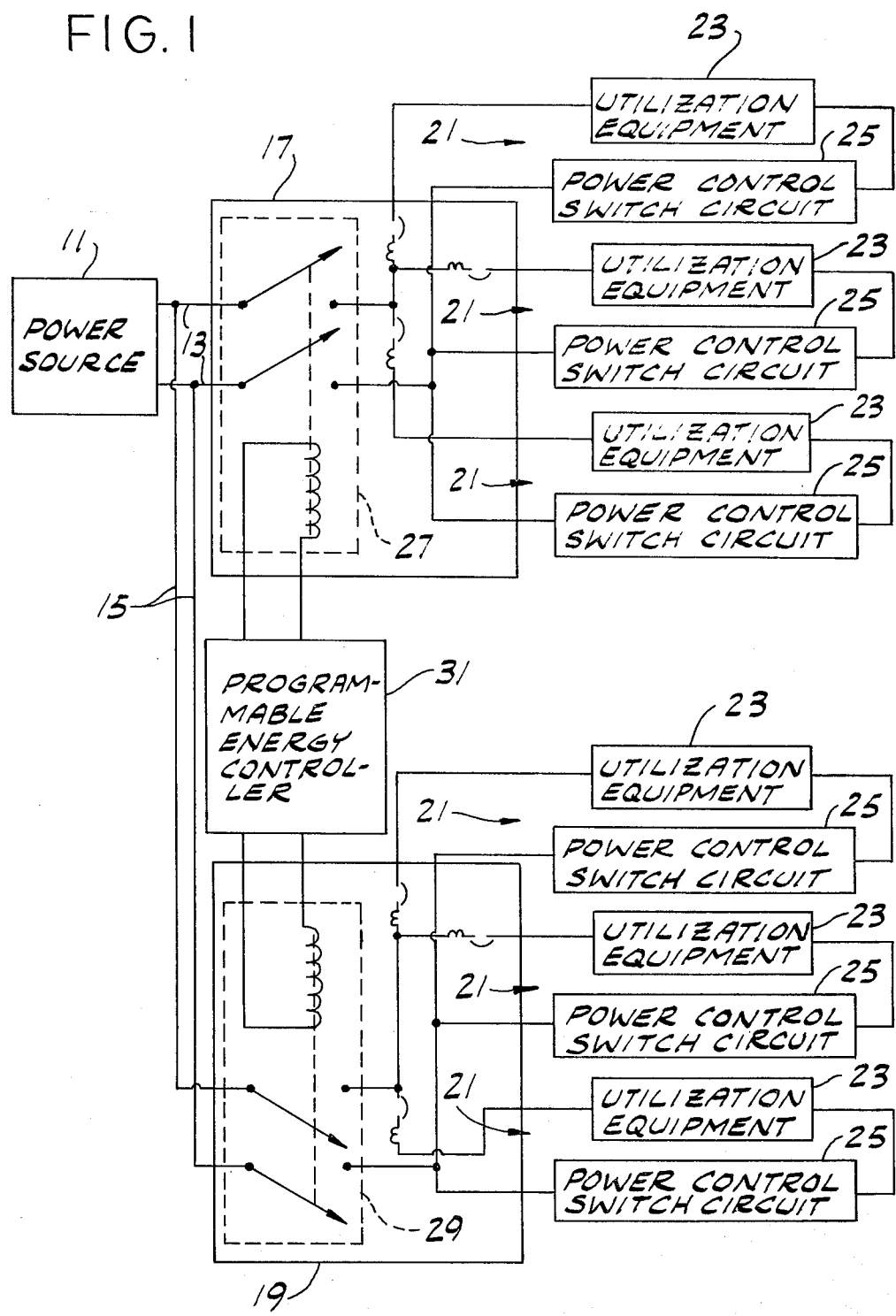
FIG. 1 is a block diagram of an energy conservation system of the invention.

Referring now to FIG. 1 of the drawings, an energy conservation system of this invention is shown in use with a power source 11 which supplies a.c. power over a pair of feeders 13, 15 to a pair of branch-circuit distribution centers 17, 19. Power source 11 typically includes the supply conductors to a building and the service equipment (i.e., main overcurrent protection devices) for the building. Each branch-circuit distribution center supplies a plurality of branch circuits 21 which include utilization equipment 23 e.g., lights and fans, connected in series with a power control switch circuit or switching circuit 25. Feeders 13, 15 and the wiring of branch circuits 21 constitute premises wiring over which power source 11 supplies power to utilization equipment 23.

Two contactors 27, 29 under the control of a programmable energy controller 31 are disposed in branch-circuit distribution centers or control centers 17, 19 for making and breaking the circuits between power source 11 and utilization equipment 23 as directed by the programmable energy controller. Controller 31, which can be a computer, is programmed to open contactors 27, 29 at predetermined times, e.g., on the hour from 8:00 p.m. to 5:00 a.m., for a few cycles to temporarily interrupt the supplying of power to the utilization equipment and then to reclose them to restore power. Thus, programmable energy controller 31 and contactors 27, 29 constitute means for temporarily interrupting the supplying of power from power source 11 to the utilization equipment. During the time the power to the utilization equipment is interrupted, that equipment becomes deenergized and it remains deenergized once power is restored. This continuing deenergization of the utilization equipment occurs because each switching circuit 25 is responsive to the temporary interruption of power to open the circuit between power source 11 and its associated utilization equipment and to maintain that circuit open after the temporary interruption of power ceases.

It should be appreciated that the predetermined times at which power is interrupted are selected to result in the maximum energy savings with the minimum inconvenience to occupants of the building or buildings whose energy use is being managed by controller 31. Times at which low levels of usage are projected, such as at night or on weekends for an office building, would be preferable times in which to temporarily interrupt power to the utilization equipment. Moreover, the times selected may differ for different buildings or parts of buildings as desired. For example, energy controller 31 can be programmed to interrupt power at distribution center 17 at times which are completely different from the times at which power is interrupted at distribution center 19. Of course in areas where personnel regularly work during off hours or areas in which power should not be interrupted because of safety considerations this system would not be used. It should also be appreciated that the energy conservation system of this invention need not use a computer to initiate the interruptions of power. Other timing controls would also work, and in fact the temporary interruption of power could be manually controlled.

Each switching circuit 25 (see FIG. 2) includes a triac 33 whose gate is connected through a diac 35 to a full-wave bridge 37. The triac is connected by a terminal T1 to the associated utilization equipment and by a terminal T2 to one side, labelled L1, of the a.c. line from the distribution center. Thus circuit 25 is a single-pole, two terminal electronic circuit connected in series between the power source and at least a portion of the utilization equipment. The other side of the a.c. line, labelled L2, is connected to opposite side of the utilization equipment. Thus, when triac 33 conducts, equipment 23 is energized. For 120 V operation, a 22K resistor R1 in series with the parallel combination of a light-emitting diode (LED) D1 and a diode D3 is connected between the utilization equipment side of the triac and the bridge side of the diac. A 0.1 mfd capacitor C1 is connected between line L1 and the bridge side of the diac 35. Triac 33 and diac 35 constitute control means for opening and closing a circuit, namely the circuit through the triac, between terminals T1 and T2 and hence between the utilization equipment and the power source. They are responsive to the temporary interruption of power from power source 11 to at least a portion of the utilization equipment (e.g., that portion shown in FIG. 2) to open that circuit, because with no gating pulses triac 33 remains nonconductive, thereby automatically deenergizing that portion of the utilization equipment upon interruption of the power. An npn transistor Q1 is connected across the output of bridge 37 so that when transistor Q1 conducts bridge 37 is substantially shorted out. The base of transistor Q1 is connected to the source of a field-effect transistor (FET) Q3 whose drain is connected through a 10K resistor R3 to the positive output side of the bridge and whose gate is also connected, through a diode D5 to a circuit consisting of the series combination of a 0.1 mfd capacitor C3 and a 100K resistor R9, which circuit is connected across bridge 37. The gate of FET Q3 is also connected through a 14K resistor R5 to one contact CT1 of a manually operable single-pole, double throw, center-off switch SW1, which is preferably a momentary-on rocker switch which is biased to its center or neutral position. When switch SW1 is in one position it connects resistor R5 to the negative output side of the bridge and when it is in the other position (closing a circuit through a contact CT2) it connects the source of FET Q3 to said negative side. Each switching circuit 25 also includes a 470K resistor R7 and a 0.1 mfd capacitor C5 connected in parallel between the gate of FET Q3 and the negative side of the bridge.

The operation of the energy conservation system of this invention is as follows: While power is supplied over lines L1 and L2 to utilization equipment 23, e.g., lights 23, the output of bridge 37 is a pulsating waveform which is supplied to the series combination of capacitor C3 and resistor R9. This waveform occurs at the anode of diode D5 and whenever it is sufficiently negative to bias that diode on, the gate of FET Q3 becomes negative (or more negative) with respect to its source. FET Q3 is chosen to have a gate to source cut-off voltage of approximately −2 V and the values of the other components in the circuit are selected to ensure that when power is supplied to bridge 37 and the lights are on the gate to source voltage will not be substantially greater than the cut-off voltage. Since under these conditions FET Q3 is nonconducting, transistor Q1 is also off. When transistor Q1 is in the off state, diac 35 is triggered, which turns triac 33 on each cycle. Thus, in this state of the circuit, lights 23 remain on so long as power is continuously supplied over lines L1 and L2.

Figure 2:
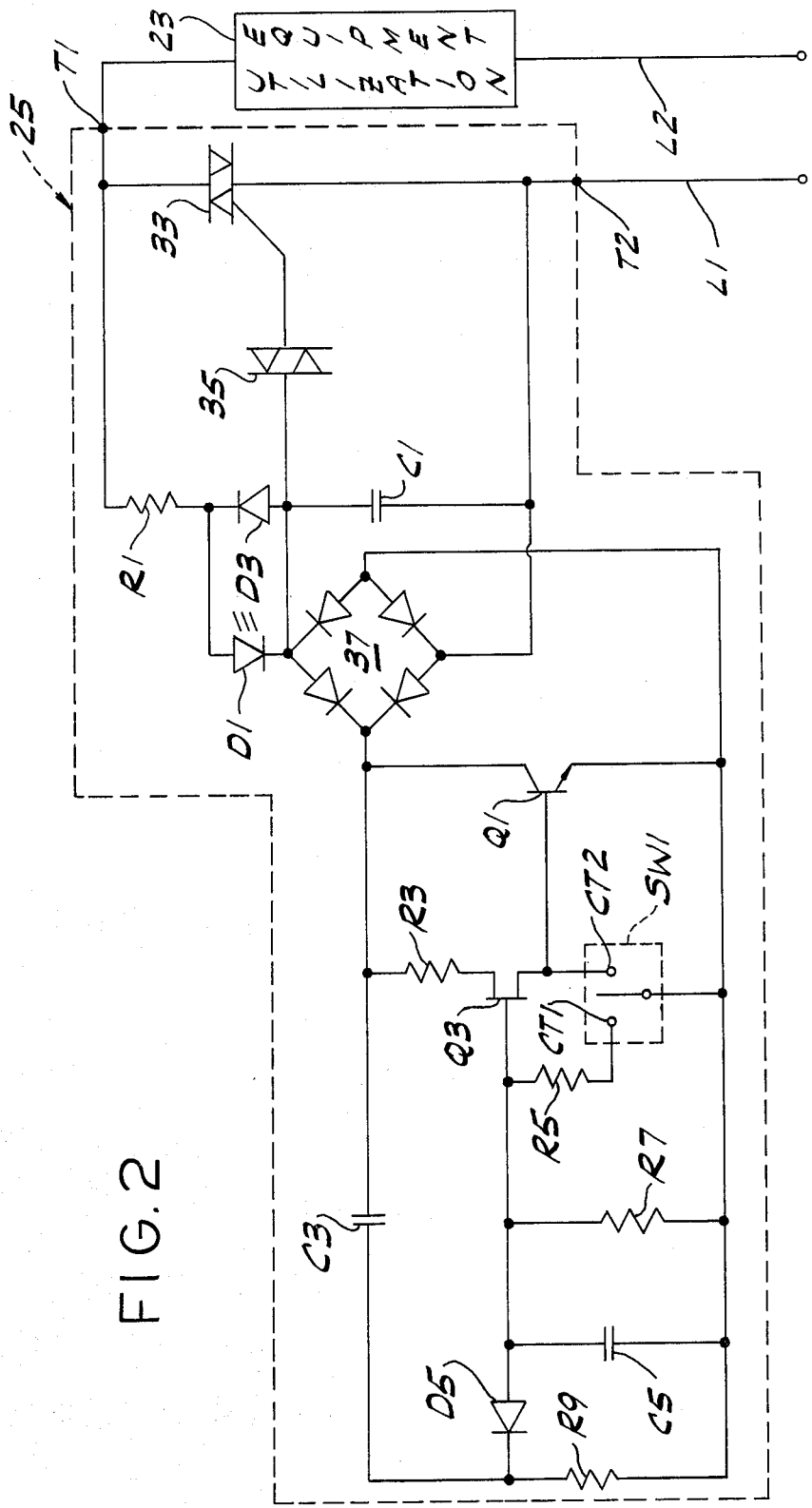
FIG. 2 is an electrical schematic of a switching circuit of the invention connected in series between a power source and utilization equipment.

At predetermined times, programmable energy controller 31 causes power to the utilization equipment to be temporarily interrupted. As an example, assume the utilization equipment and switching circuit shown in FIG. 2 is the topmost branch circuit shown in FIG. 1. When programmable energy controller 31 causes contactor 17 to open for a few cycles and then close again, power to the circuit of FIG. 2 is temporarily interrupted. When this occurs, capacitor C5 discharges and the voltage on the gate of FET Q3 becomes approximately zero. This turns on FET Q3 which in turn turns on transistor Q1. Conduction by transistor Q1 reduces the voltage across bridge 37 to approximately zero as well and diac 35 is not triggered. Consequently triac 33, and lights 23 in series therewith, stay off after the temporary interruption of power. In this condition of the circuit, the output of bridge 37 is so low that diode D5 is not biased and the gate of FET Q3 stays at zero volts until the circuit is manually reset. Thus, transistor Q1, FET Q3 and their associated components constitute means for maintaining the circuit between the power source and the portion of the utilization equipment open after interruption of power and for keeping a semiconducting device, namely triac 33, off, thereby keeping that portion of the utilization equipment deenergized after power is restored.

Circuit 25 is manually reset by momentarily actuating switch SW1 to move its switch arm into contact with contacts CT2. This action ties the base and emitter of transistor Q1 together, turning it off. The output of bridge 37 is no longer substantially shorted, so the voltage at the gate of FET Q3 goes −2 V negative with respect to its source, thereby turning off FET Q3 and keeping off transistor Q1. The output of bridge 37 stays high, diac 35 is triggered, and triac 33 turns on and keeps on lights 23. Switch SW1 is then released and returns to its centeroff position. Thus switch SW1 constitutes means for manually resetting switching circuit 25 to close the circuit through the triac as desired after power is restored by turning on the triac, and in fact constitutes the only way to reenergize the utilization equipment.

Lights 23 can also be turned off independently of programmable energy controller 31. To do this a person closes switch SW1 through contact CT1. This action causes capacitor C5 to discharge and the voltage on the gate of FET Q3 to rise to approximately zero. FET Q3 conducts, as does transistor Q1, which reduces the voltage across bridge 37 to the point where diac 35 is no longer triggered and triac 33 goes off and stays off. With triac 33 off, the lamps are deenergized.

It should be appreciated that switching circuit 25 does not require that both sides of the a.c. line be physically accessible in order to function. All that is required is that one side of the line, i.e., line L1, be accessible for insertion of the switching circuit. Of course in many instances only one side of the a.c. line is present in the wall boxes of ordinary wall switches. Because it only needs one side of the line and because of its compact size, switching circuit 25 may be used, without rewiring, to replace an ordinary wall switch in a building in which the energy conservation system of this invention is used. When so used, LED D1 is exposed through the face plate on the wall and indicates the position of switching circuit 25, including switch SW1, when the lights or other utilization equipment controlled by circuit 25 are off.

In view of the foregoing it can be seen that the method of the present invention includes the steps of automatically and temporarily interrupting at predetermined times the supplying of power from a power source to at least a portion of utilization equipment such as lighting equipment and the like; automatically opening the circuit between the power source and said portion of the utilization equipment in response to the temporary interruption of power by turning off a semiconducting device; and maintaining the circuit between the power source and said portion of the utilization equipment open and the semiconducting device off after the temporary interruption of power ceases until said semiconducting device is manually caused to be turned on, whereby said portion of the utilization equipment is automatically deenergized upon interruption of the power thereto and remains deenergized until the circuit is manually caused to be closed.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. An energy conservation system for use with a power source which supplies power over premises wiring to utilization equipment such as lighting equipment and the like, said system comprising:
   means independent of the magnitude of the electrical load drawn by the utilization equipment for temporarily interrupting at predetermined times the supplying of power from the power source to at least a portion of the utilization equipment; and
   at least one switching circuit connected in series between the power source and said portion of the utilization equipment, said switching circuit being responsive to the temporary interruption of power to open the circuit between the power source and said portion of the utilization equipment and to maintain said circuit open after the temporary interruption of power ceases, thereby automatically deenergizing said portion of the utilization equipment upon interruption of the power.

2. An energy conservation system as set forth in claim 1 wherein the switching circuit includes a first terminal for connection to said portion of the utilization equipment, a second terminal for connection to the power source, and control means for opening and closing a circuit between said two terminals, said control means being responsive to the temporary interruption of power from the power source to open the circuit between the two terminals.

3. An energy conservation system as set forth in claim 2 wherein the control means further includes means for manually resetting the switching circuit to close the circuit between the two terminals as desired after power is restored, whereby said portion of the utilization equipment is reenergized only upon manual resetting of the switching circuit.

4. An energy conservation system as set forth in claim 1 wherein the switching circuit is a single-pole, two terminal circuit.

5. An energy conservation system as set forth in claim 1 wherein the switching circuit further includes means for manually resetting the power control switching circuit to close the circuit between said portion of the utilization equipment and the power source as desired after power is restored, whereby said portion of the utilization equipment is reenergized only upon manual resetting of the switching circuit.

6. An energy conservation system as set forth in claim 1 wherein the means for temporarily interrupting the supplying of power constitutes means for automatically interrupting the supplying of power at predetermined times.

7. A single pole, two-terminal electronic switching circuit for use in an energy conservation system and adapted to be connected in series in premises wiring between a power source and utilization equipment such as lighting equipment and the like, said switching circuit comprising:
   a first terminal for connection to the utilization equipment;
   a second terminal for connection to the power source, whereby when so connected the switching circuit is in series between the power source and the utilization equipment;
   means responsive to a predeterminedly timed temporary interruption of power from the power source to at least a portion of the utilization equipment to open the circuit between the power source and said portion of the utilization equipment, thereby automatically deenergizing said portion of the utilization equipment upon interruption of the power;
   means for maintaining the circuit between the power source and said portion of the utilization equipment open after the interruption of power, thereby keeping said portion of the utilization equipment deenergized after power is restored;
   manually operable resetting means for closing the circuit between said portion of the utilization equipment and the power source as desired after power is restored, whereby said portion of the utilization equipment is reenergized only upon manual resetting of the switching circuit; and
   manually operable means for deenergizing said portion of the utilization equipment in the absence of any interruption of power supplied thereto.

8. An electronic switching circuit as set forth in claim 7 wherein the manually operable resetting means and said means for deenergizing the power control switching circuit are comprised by a single pole, double throw switch having a first position for manually effecting energization of said portion of the utilization equipment and having a second position for manually effecting deenergization of said portion of the utilization equipment in the absence of a temporary power interruption.

9. An energy conservation method comprising:
   automatically and temporarily interrupting at predetermined times the supplying of power from a power source to at least a portion of utilization equipment such as lighting equipment and the like;
   automatically opening the circuit between the power source and said portion of the utilization equipment in response to the temporary interruption of power by turning off a semiconducting device; and maintaining the circuit between the power source and said portion of the utilization equipment open and the semiconducting device off after the temporary interruption of power ceases until said semiconducting device is manually caused to be turned on, whereby said portion of the utilization equipment is automatically deenergized upon interruption of the power thereto and remains deenergized until the circuit is manually caused to be closed.

10. The energy conservation method as set forth in claim 9 wherein the power to said portion of the utilization equipment is temporarily interrupted more than once during the day.

11. The energy conservation method as set forth in claim 9 wherein the power to said portion of the utilization equipment is interrupted at predetermined times which are selected based upon projected low levels of usage of said portion of the utilization equipment at said predetermined times.

12. An energy conservation system as set forth in claim 5 in which the switching circuit further includes manually operable means for deenergizing said portion of the utilization equipment in the absence of any interruption of power supplied thereto.

13. An energy conservation system as set forth in claim 12 wherein said manually operable means for resetting the switching circuit and said manually operable means for deenergizing the power control switching circuit are comprised by a single pole, double throw switch having a first position for manually effecting energization of said portion of the utilization equipment and having a second position for manually effecting deenergization of said portion of the utilization equipment in the absence of a temporary power interruption.

* * * * *